United States Patent [19]

Hendricks

[11] Patent Number: 4,952,109

[45] Date of Patent: Aug. 28, 1990

[54] MODULAR FEEDING TRAY FOR VIBRATING CONVEYORS

[75] Inventor: Ross D. Hendricks, Palos Verdes Peninsula, Calif.

[73] Assignee: Excellon Automation, Torrance, Calif.

[21] Appl. No.: 158,277

[22] Filed: Feb. 19, 1988

[51] Int. Cl.⁵ ............................................. H05K 3/30
[52] U.S. Cl. ..................................... 414/224; 29/741; 221/93; 221/92; 221/312 R; 901/40; 414/797.4; 414/415; 414/416; 414/276; 414/225
[58] Field of Search ............... 414/403, 415, 416, 276, 414/225, 798, 9, 224, 798, 797.4; 221/93, 98, 183, 200, 202, 241, 242, 92, 101, 312 R; 29/741; 901/40; 198/752

[56] References Cited

U.S. PATENT DOCUMENTS

| | | |
|---|---|---|
| 1,495,610 | 5/1924 | Paridon . |
| 2,164,676 | 7/1939 | Appleyard et al. . |
| 2,840,090 | 6/1958 | Bradford . |
| 3,591,911 | 7/1971 | Goldschmied .................... 29/741 X |
| 3,854,610 | 12/1974 | Carder . |
| 3,958,687 | 5/1976 | Adams et al. . |
| 4,042,100 | 8/1977 | Morrone . |
| 4,212,102 | 7/1980 | Drinkard, Jr. ........................ 29/741 |
| 4,250,615 | 2/1981 | Knuth et al. ...................... 221/93 X |
| 4,304,514 | 12/1981 | Pfaff .................................... 414/224 |
| 4,314,628 | 2/1982 | Calbert et al. ............... 221/312 R X |
| 4,444,303 | 4/1984 | Burgess, Jr. . |
| 4,492,297 | 1/1985 | Sticht . |
| 4,586,251 | 5/1986 | Kinoshita et al. .................... 29/741 |
| 4,611,846 | 9/1986 | Feiber et al. ..................... 901/40 X |
| 4,690,302 | 9/1987 | Zebley et al. ..................... 29/741 X |
| 4,718,531 | 1/1988 | Bianchi et al. ................ 414/224 X |
| 4,733,459 | 3/1988 | Tateno ................................. 29/741 |
| 4,761,106 | 8/1988 | Brown et al. .................. 414/224 X |
| 4,823,983 | 4/1989 | Groover et al. ...................... 221/92 |

FOREIGN PATENT DOCUMENTS

| | | | |
|---|---|---|---|
| 763276 | 7/1967 | Canada ................................. 221/92 |
| 2422630 | 11/1974 | Fed. Rep. of Germany ........ 29/741 |
| 116422 | 5/1987 | Japan ............................... 414/797.4 |

Primary Examiner—Frank E. Werner
Attorney, Agent, or Firm—Knobbe, Martens, Olson & Bear

[57] ABSTRACT

An apparatus for advancing a plurality of components comprising a vibrating feed tray, having a plurality of interchangeable modular troughs, each sized to receive a component of a particular size. The troughs are removably and slidably secured to the tray, and can be used in any combination. One end of each trough is characterized by only one side wall. A second, parallel side wall is provided each trough by means of sharing the side wall of the adjoining trough. In the event that there is no directly adjacent trough, a side stop is positioned adjacent the open side of the trough.

6 Claims, 3 Drawing Sheets

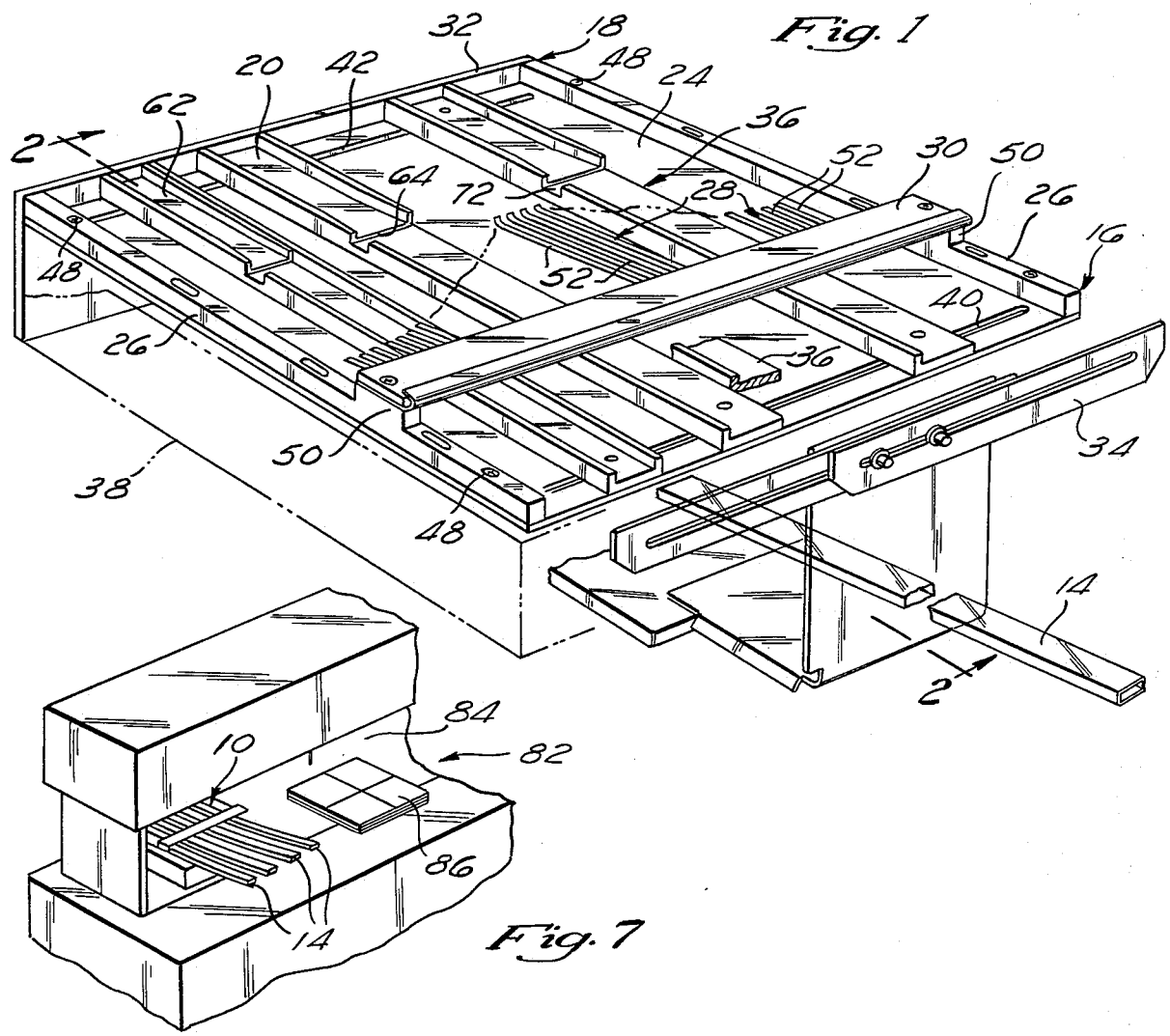
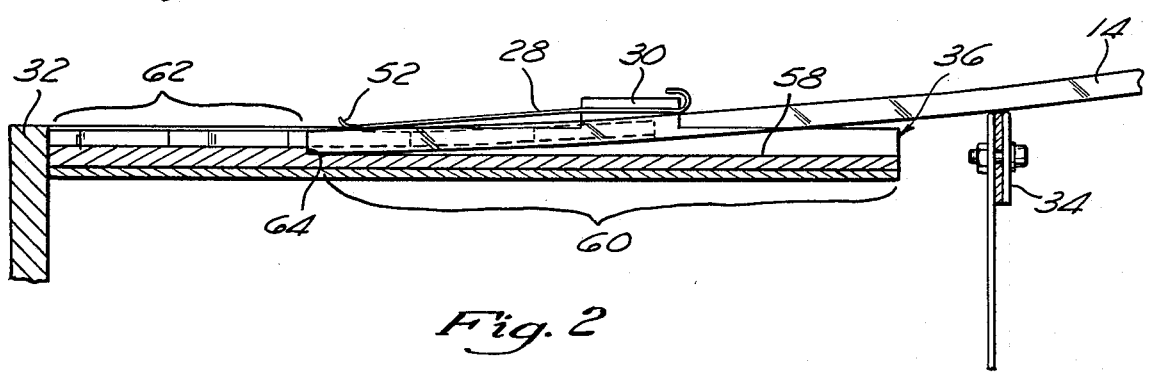

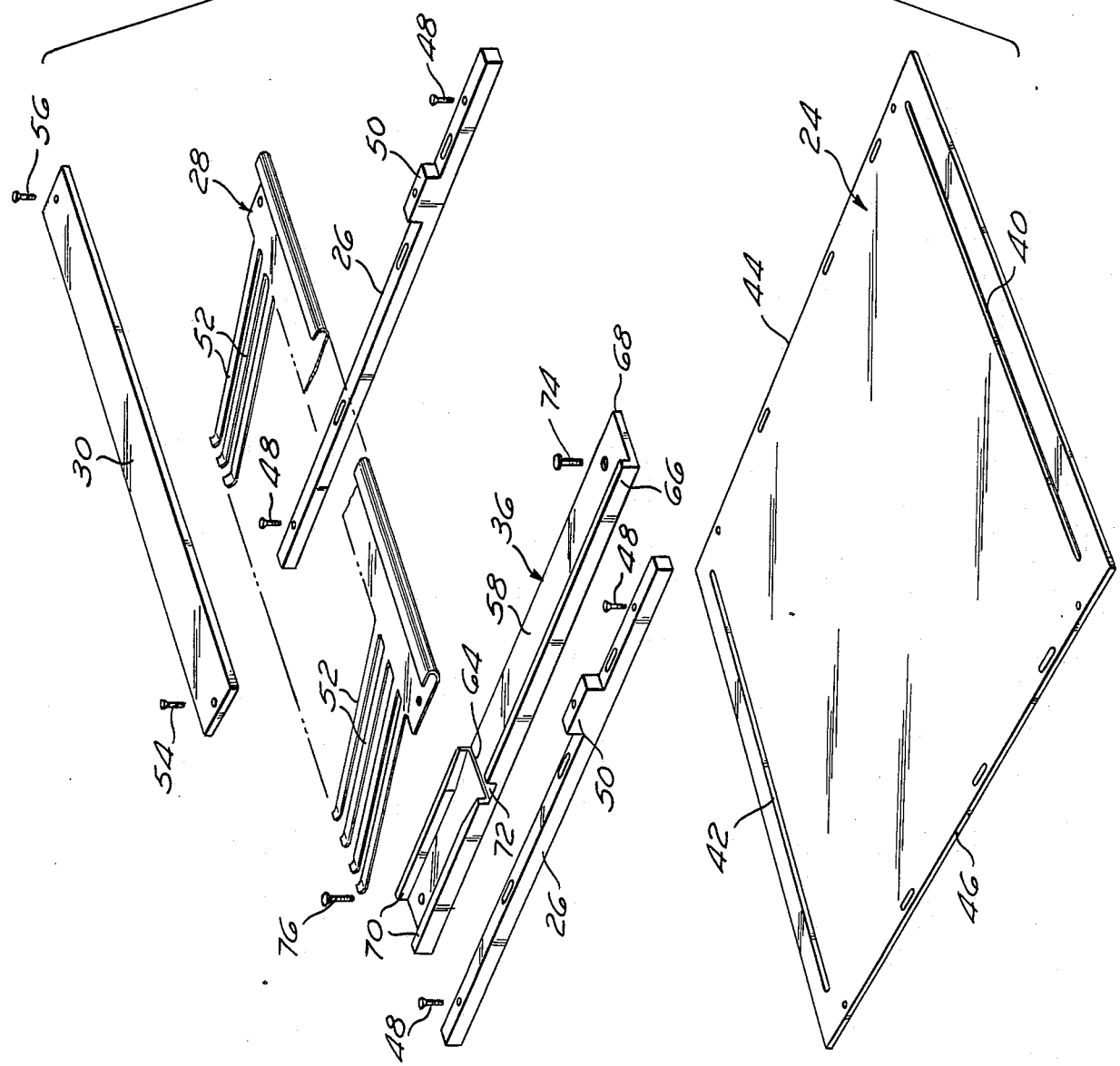

MODULAR FEEDING TRAY FOR VIBRATING CONVEYORS

BACKGROUND OF THE INVENTION

The present invention relates generally to the field of vibrating conveyors, and in particular to parts feeders for feeding electronic components to "pick and place" machines which mount such components on, for example, printed circuit boards.

The assembly of surface mounted printed circuit boards required the placement of a wide variety and large number of small electronic components on the surface of the board in precisely located, predetermined positions. The repetitive nature of this task has led to the development of computer controlled, automatic "pick and place" machines which pick up electronic components from a "pick" station, move the component to the printed circuit board, and "place" the component at a precisely defined, predetermined location on the circuit board. To maintain a steady supply of components at the "pick" station, like components are packaged in elongate, open ended tubes. A plurality of tubes, each containing different components, are mounted on a vibrating feed tray such that the components advance out of the tubes. To guide the components to their respective "pick" station, channels or troughs must be provided on the tray. It is critical that each channel be properly dimensioned corresponding to the respective components and tubes so that the component is oriented in a predictable fashion when it arrives at the "pick" station. If not properly oriented, the component may not be able to be lifted from the "pick" station, or if it is lifted, it will not be placed in the proper orientation on the printed circuit board.

Many designs have been utilized for guiding the components through channels or troughs. Typically, an array of such troughs are formed on the feed tray which, in turn, is secured to a vibrator. Early attempts at accommodating a wide array of component parts having varying shapes and sizes was to machine a tray exhibiting a plurality of fixed channels of different sizes. This approach proved effective for the particular application for which the tray was machined, but a change in any of the component parts to be fed necessitated machining a new tray. Further, since the tray was machined for a specific application, it was seldom, if ever reusable, and thus the cost of employing such units proved very expensive.

Accordingly, there is a need for an adjustable feed tray, which would enable one to reuse the tray for feeding a variety of different sized components. One approach in the prior art of providing such adjustability was to provide a tray having fixed channel members, and adding spacers to change the width of the channel. The problem with an arrangement of this type was that the troughs were of a width predefined by the fixed channel members, and could therefore only be narrowed. Thus, if the component to be used was wider than the trough, an entire new tray would have to be machined. Further, due to space limitations on the tray, there is a direct trade off between having wider channels and having a large number of channels. Thus, the greater the distance between fixed channel members, the greater the width of the channel, but the smaller the number of channels available.

Another approach to providing the much needed adjustability of the width of the troughs was to provide a tray having a plurality of movable, vertical side walls, whereby two adjacent side walls form a channel. In this arrangement, when it was desired to adjust the width of the channel to accommodate differing sized parts, the side walls were moved laterally to either widen or narrow the channel. The problem with such lateral movement was that the widening of one channel necessarily narrowed the adjacent channel. Thus, when it was desired to change the width of one channel, adjustment of the adjacent channels was also necessitated. Since the width of each channel must be precisely selected to provide the necessary tolerances with respect to the component being fed through the channel, it is a time consuming task to properly align the side walls so that all of the channels are properly dimensioned.

Accordingly, there is a need in the art for a feed tray which allows flexibility as to different size parts, quick and precise adjustment of the channels or troughs on the tray, and which allows a wide selection of channel widths without necessarily limiting the number of channels available.

SUMMARY OF THE INVENTION

Briefly, the present invention is a feed tray adapted to advancing a plurality of components of varying sizes from a plurality of independent sources to a first predetermined location, where they may be engaged by a machine which moves these components to a second predetermined location. In a preferred embodiment, the apparatus comprises a base plate, secured to a vibrator, and a plurality of interchangeable troughs, removably secured to the base plate so as to enable a versatile arrangement of the troughs on the tray. Each of the troughs is sized to accommodate a different sized component, and may be independently used in any combination. The feed tray also has a pair of slots, extending across the base plate, proximate to the proximal and distal ends of the feed tray, respectively, and normal to the paths of components. Fasteners, secured to the troughs, extend through the slots to secure the troughs to the base plate. Advantageously, these slots allow lateral movement of the troughs once they are placed on the tray to accommodate a variety of arrays of different sized troughs.

Preferably, the components to be fed to the trough are encased in plastic shipping tubes which are rectangular in cross section. These tubes are inserted into the proximal end of their respective troughs. The free ends of the tubes are supported in an inclined manner by a bracket tube support. The tubes are held in place by a tube cover, the fingers of which provide frictional resistance to movement of the tubes. Preferably, two side bars are fixed along opposing edges of the base plate, and a holding plate spanning the bars. The tube cover extends laterally across the feed tray and is sandwiched between the side bars and the holding plate.

As an important feature of the invention, in order to save space and reduce material requirements, each of the troughs has only one side wall at its proximal end, and shares the side wall of an adjoining trough. A removable side stop is secured to the base plate to form a side wall to a trough in the event it is not adjacent another trough. The side stop is preferably secured to the base plate through the slots, permitting lateral movement of the side stop.

In a preferred embodiment, each trough is comprised of generally two regions: a receiving portion, a discharge portion. An upwardly facing surface on the trough extends between the two regions. The receiving portion is located at the proximal end of the trough, and is characterized in that it has only one side wall. The receiving portion is sized to receive the plastic shipping tubes, and guide the tubes down the length of the trough until the tube abuts a ledge member. The ledge member separates the receiving portion from the discharge portion, and is sized so as to provide a smooth transition of the component parts from the tube onto the upwardly facing surface of the trough, which supports the components as they advance to the first predetermined location.

Vibration of the tray aids the individual components in migrating from the shipping tube onto the feed trough. As the components travel down the length of the trough, they are funneled between a pair of aligning walls, disposed in the discharge portion of the trough. The aligning walls taper and narrow as they approach the distal end of the trough and serve to center and orient the part within the trough so that it may be lifted from the first predetermined location, and placed in the proper orientation at the second predetermined location. A stop plate is provided at the distal end of the trough to keep components from falling off the end of respective troughs, and to hold the components in place until they can be lifted from the trough by any number of means.

BRIEF DESCRIPTION OF THE DRAWINGS

FIG. 1 is a perspective view of the feed tray of the present invention;

FIG. 2 is a side elevation taken along line 2—2 of FIG. 1;

FIG. 3 is an exploded perspective view of the feed tray of the present invention;

FIG. 7 is a perspective view of a pick and place machine incorporating the feed tray of the present invention.

DETAILED DESCRIPTION OF THE PREFERRED EMBODIMENT

Figure 4:
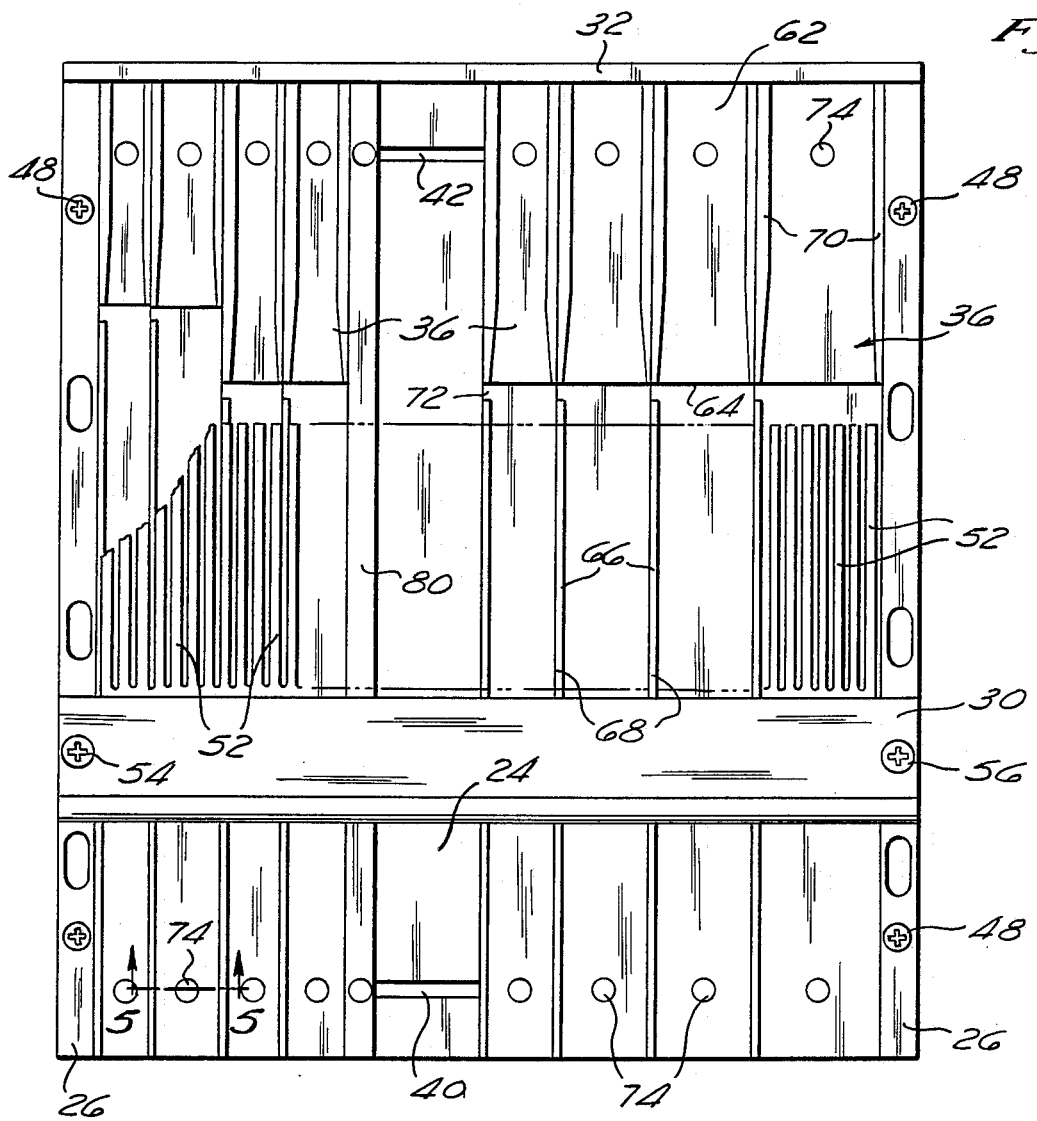
FIG. 4 is a plan view of the feed tray of the present invention.

In FIG. 1, a feed tray 10, consistent with the present invention is shown in exploded perspective fashion. The feed tray 10 is adapted to advance components 12 from a plurality of independent sources 14, disposed at a proximal end 16 of the tray 10 to respective first predetermined locations 20, or "pick" stations, disposed at a distal end 18 of the tray 10. The components 12, upon reaching the end of the tray 10, are ready to be lifted from the tray 10 and carried to a precisely defined second predetermined location 86 (see FIG. 7), or "place" station. With reference to FIG. 1, the tray 10 comprises a base plate 24, a pair of side bars 26, a tube cover 28 and holding plate 30, a stop plate 32, a bracket support 34, and a plurality of interchangeable modular troughs 36, all of which are described in greater detail below. The feed tray 10 is secured to a vibrator 38 which aids the advancement of components 12 from respective sources 14 to their respective pick stations 20.

Preferably, each of the independent sources 14 of components comprises a plastic shipping tube, substantially rectangular in cross-section. To maintain a steady supply of components to the "pick" station, the tubes are packaged with like components, however components may vary among different tubes. Each tube 14 is adapted to be removably inserted into a respective trough 36. The tubes 14 are supported in an inclined manner at one end by a raised tube bracket support 34, disposed at the proximal end 16 of the tray 10. The tube bracket support 34 is selectively adjustable as to both the number of tubes it will support, corresponding to the width of the tray 10, and as to the amount of inclination of the tubes. The inclined manner in which the tubes 14 are supported aids in the migration of the components 12 from the tubes 14 onto their respective troughs 36.

FIG. 3 is an exploded perspective view of the feed tray 10 of the present invention. The base plate 24 of the feed tray 10 is planar substantially rectangular in cross-section, and has a proximal end and a distal end corresponding to the proximal and distal ends 16, 18 of the feed tray 10. Proximate to each of these ends is an elongated, linear slot 40, 42 extending through the base plate 24. The base plate 24 has a pair of parallel, opposed side edges 44, 46 which extend normal to the slots 40, 42. A pair of side bars 26 are secured along the side edges 44, 46 and extend substantially along the entire length of the tray 10. The side bars 26 can be secured directly to the base plate 24, for example, by means of a screw and washer assembly 48, at each end of each side bar 26. Each of the side bars 26 further exhibits an elevated support member 50. When the side bars 26 are secured to the base plate 24, the elevated support member 50 lies substantially toward the proximal end 16 of the tray 10.

Spanning the side bars 26 is a comb-like tube cover 28. The tube cover 28 has a plurality of resilient metal fingers 52 which serve to bias the tubes 14 against the tray 10 by providing frictional resistance to movement thereof. The tube cover 28 is sandwiched between the elevated support members 50 by a planar holding plate 30 which preferably is secured to the elevated supports 50 by a pair of screw and washer assemblies 54, 56.

Figure 6:
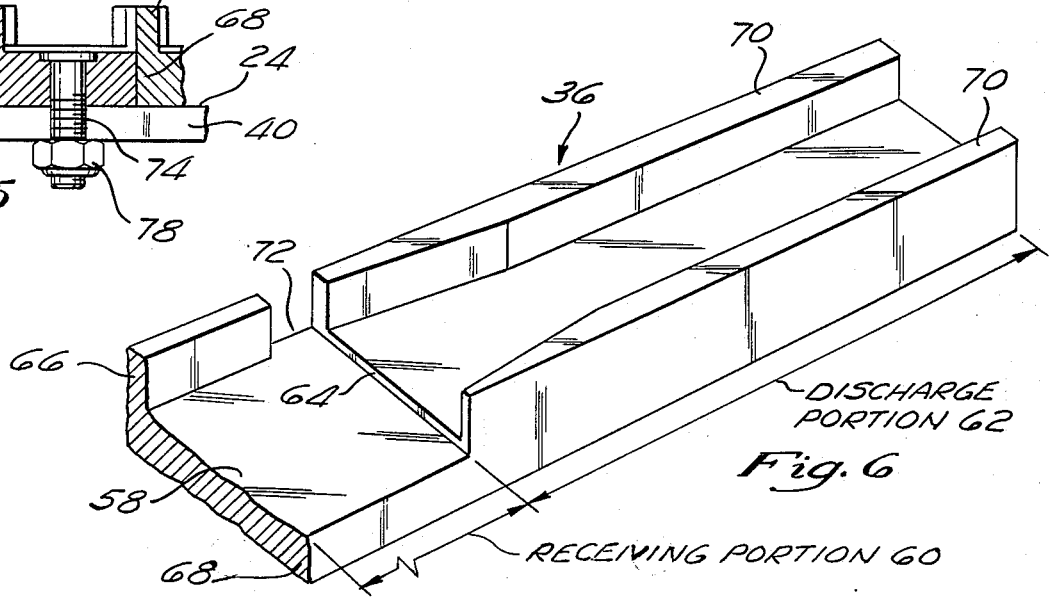
FIG. 6 is a perspective view of a modular trough of the present invention.

A perspective view of a typical trough, consistent with the present invention, is shown in FIG. 6. An upwardly facing surface 58 of the trough 36 forms a receiving portion 60, disposed proximate to the proximal end 16 of the tray 10, a discharge portion 62, disposed proximate to the distal end 18 of the tray 10, with the receiving portion 60 and discharge portion 62 being separated by a ledge 64 therebetween. To conserve materials and increase the number of troughs 36 which can be secured to the tray 10, which is of limited width, each trough 36 is equipped with only one side wall 66 along the receiving portion 60 thereof. The side of the receiving portion 60 which does not include a side wall 66 is referred to as an open side 68. Advantageously, by positioning the troughs 36 adjacent to one another on the base plate 24, the open side 68 of one trough 36 shares the side wall 66 of the trough 36 abutting the open side 68, thus effectively providing each trough 36 with a pair of parallel side walls.

In addition to the side wall 66 in the receiving portion 60 of each trough 36, a pair of parallel aligning walls 70 are provided in the discharge portion 62 thereof. A gap 72 is formed between the side wall 66 and the aligning wall 70 at the ledge portion 64 to facilitate the ease of machining of the trough. The aligning walls 70 taper and narrow as they approach the distal end 18 of the tray 10, such that as a component 12 travels down the length of the trough 36 it will be centered therein. This is an important factor, especially in the field of pick and place machines, wherein electronic components are surface mounted onto printed circuit boards. In this case, proper alignment of the components prior to being lifted from the trough is critical, since if the component is misaligned when lifted, it will be misaligned when placed on the printed circuit board, and will not establish the proper electrical contacts.

Referring now to FIG. 2, there is shown an elevational view, taken along line 2—2 of FIG. 1, depicting a singular modular trough 36 with a supply tube 14 inserted therein. As depicted in the figure, the supply tube 14 is removably inserted into the receiving portion 60 of a trough 36 until it abuts the ledge portion 64. Advantageously, the ledge portion 64 is of the same thickness as that of the supply tube 14. Therefore, as the components 12 exit the tube 14 and enter the trough 36, the transition therebetween is substantially smooth and uniform.

Disposed at the distal end 18 of the feed tray 10 is a stop plate 32. The stop plate 32 is secured to the base plate 24 proximate to the distal end 18 of the troughs to prevent components 12 from falling off the end of their respective troughs. Preferably, the position of a component 12 abutting against the stop plate 32 is at the first predetermined location 20, or "pick" station.

FIG. 4 is a plan view of the feed tray 10 of the present invention and shows a typical arrangement of troughs 36 secured to the base plate 24 in a manner consistent with the present invention. Each trough is laterally slidable on the base plate 24 to a variety of different positions.

Figure 5:
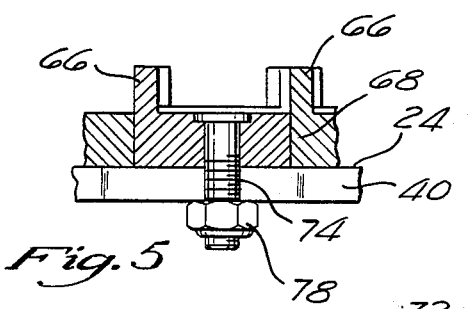
FIG. 5 is a side elevation in partial cross-section, depicting how the modular troughs are secured within the slots of the base plate.

As is best shown in FIGS. 3 and 5, a pair of studs 74, 76 having threaded ends are pressed into apertures through the upwardly facing surface 58 of each trough 36. The apertures are positioned so that the studs 74, 76 align with the slots 40, 42 in the base plate 24. The threaded end of the stud extends through the slot and mates with a nut 78 beneath the base plate 24 so as to removably fasten the troughs to the base plate 24. The studs are slidable laterally within the slots when the nuts are loosened or removed, so as to permit positioning of the trough at any desired location across the width of the base plate 24.

As discussed above, since each trough has only one side wall 66 in the receiving portion 60 thereof, troughs adjacent one another share a common side wall. As is best seen in FIGS. 1 and 4, the side bars 26 are also adapted to effectively provide a second side wall to an adjacent abutting trough. In the event that there is no adjacent trough 36 or side bar 26 to effectively provide the second side wall, a side stop 80 can be utilized. The side stop 80 is an elongate bar, which is removably secured to the base plate 24 of the tray 10. When placed adjacent the open side 68 of the receiving portion 60 of a trough, the side stop 80 forms a second side wall therefor. Similar to the troughs, the side stop 80 is slidably and removably secured to the base plate 24 by means of bolts which extend through the side stops and the base plate slots and mate with nuts (not shown) on the underside of the base plate 24.

Preferably, the feed tray 10 herein described is compatible for use with an automatic, computer controlled pick and place machine 82 as shown in FIG. 7. The pick and place machine may, for example, be of the kind manufactured by the assignee of the present invention, Excellon Industries, under the name SMX1. A pick and place machine of this type is adapted to lift an electronic component 12 from a pick station 20, carry the component 12 to a precisely defined second location, a place station 86, for example, a printed circuit board.

The pick and place machine shown in FIG. 7 further comprises a chuck 84 mounted to a head body (not shown). The head body provides reciprocal motion between the pick station 20 and the place station 86. The chuck 84 has a pneumatic vacuum tip for detachably securing a component 12 to the tip.

Preferably, the printed circuit boards are placed on a movable work table 86. The table 86 is adapted to position the printed circuit board relative to the chuck 84 such that when the chuck 84 is lowered to the desired place station 86, the component 12 attached thereto is precisely placed on the printed circuit board so that the leads on the component 12 establish the proper electrical contacts.

In operation, the desired array of troughs, corresponding to the various sized components to be assembled on the printed circuit board are selected and arranged on the base plate in the desired orientation. The troughs are then placed on the base plate in the desired locations. Each of the studs extends through a slot in the base plate and mates with a nut which, when tightened holds the trough in place.

To ensure that each trough effectively has two side walls in the receiving portion thereof, troughs adjacent one another share a common side wall by being abutted against one another. If the open side of a trough abuts one of the side bars of the tray, the side bar provides the effective second wall of the trough. A side stop is secured to the base plate adjacent the open side of all troughs without an adjacent trough or side bar as needed, so as to effectively provide each trough with two side walls in the receiving portion. The pick and place machine is then programmed to "pick" components from their respective "pick" stations, and "place" these components at the appropriate "place" station on the printed circuit board.

Component carrying supply tubes 14 are inserted into respective troughs 36. The free ends of the tubes 14 are supported in an inclined ski-slope manner by the tube bracket support 34. The other end of the supply tubes 14 are guided into the receiving portion 60 of each respective trough by the side walls 66 of the trough itself and its adjacent trough. The tubes 14 are carefully inserted into respective troughs in this manner until they abut the ledge member 64 of the respective troughs, and can be inserted no further. The tube cover 28 provides frictional resistance to the tubes 14 to prevent them from raising up off of the upwardly facing surface 58 of the respective troughs.

Vibration of the tray 10, as well as the inclined manner in which the tubes 14 are supported, causes the components 12 to migrate from the tubes 14 into the discharge portions 62 of their respective troughs. Upon leaving the supply tubes 14, the components 12 are guided by a pair of aligning walls 70 which serve to center the components 12 within their respective troughs. The parts continue to migrate toward the distal end 18 of the tray 10 in this fashion until they abut the stop plate 32.

The chuck 84 is then displaced downwardly towards the pick station 20, whereby the chuck comes into contact with the component 12 positioned at that location. The chuck 84 then attaches the component 12 to itself, for example, by a vacuum suction provided by the chuck. The head and chuck are then moved vertically away from the pick station 20 and positioned above the selected location above the printed circuit board on which the component 12 is to be placed. The chuck is then displaced downwardly toward the work piece, and the component 12 is pressed into the desired position.

It will be understood by those skilled in the art that other types of pick and place machines may be used with the feed tray 10 of the present invention. The foregoing detailed description is to be clearly understood as given by way of illustration, the spirit and scope of this invention being limited solely by the appended claims.

What is claimed is:

1. A feed tray for advancing a plurality of components of varying sizes from a plurality of independent sources, each of said sources supplying components which are identical in size and shape for a given source, but which may vary among said sources, each of said components from a given source being advanced by said feed tray toward a respective first predetermined location where said components may be lifted so as to be moved to a respective second predetermined location, said feed tray comprising:
   a base plate, having a proximal end for receiving said components from said independent sources, and a distal end terminating proximate said first predetermined location;
   a pair of substantially parallel side bars, secured to said base plate on opposite sides thereof;
   a plurality of interchangeable modular troughs, removably secured to said base plate and adapted to enable a versatile arrangement of said troughs on said tray, each of said troughs corresponding to one of said sources, wherein each of said sources comprises a tube, substantially rectangular in cross section, each of said troughs providing a path for guiding said components from one of said sources to said distal end of said base plate, each of said troughs sized to accommodate components of a particular size;
   a tube cover, secured to said feed tray for providing frictional resistance to movement of said tubes; and
   a holding plate, spanning said side bars, and adapted for sandwiching said tube cover therebetween.

2. An apparatus as defined by claim 1, wherein each of said side bars exhibit an elevated support member, for supporting said tube cover and said holding plate.

3. A feed tray for advancing a plurality of components of varying sizes from a plurality of independent sources, each of said sources comprising a supply tube within which components of identical size and shape are stored in a given source, but which may vary among said sources, each of said components from a given source being advanced by said feed tray toward a respective first predetermined location where said components may be lifted so as to be moved to a respective second predetermined location, said feed tray comprising:
   a base plate, having a proximal end for receiving said components from said independent sources, and a distal end terminating proximate said first predetermined location; and
   a plurality of interchangeable modular troughs, removably secured to said base plate and adapted to enable a versatile arrangement of said troughs on said tray, each of said troughs corresponding to one of said sources and providing a path for guiding said components to said distal end of said base plate, each of said troughs sized to accommodate components of a particular size, each of said interchangeable modular troughs comprising:
   an upwardly facing surface, upon which said supply tubes and said components travel;
   a side wall, secured to said upwardly facing surface of said trough on one edge thereof, said upwardly facing surface having an edge parallel to said side wall forming an open side, wherein each side wall of each of said troughs is adapted to abut the open side of an adjacent trough and effectively form a second side wall on said adjacent trough, for guiding said supply tubes down the length of said trough; and
   a ledge portion, forming a discontinuity along said upwardly facing surface said ledge portion proportionately sized such that said supply tube abuts said ledge portion to provide a substantially smooth transition for said components from said supply tube onto said upwardly facing surface of said trough.

4. A feed tray for advancing a plurality of components of varying sizes from a plurality of independent sources, each of said sources comprising a supply tube within which components of identical size and shape are stored in a given source, but which may vary among said sources, each of said components from a given source being advanced by said feed tray toward a respective first predetermined location where said components may be lifted so as to be moved to a respective second predetermined location, said feed tray comprising:
   a base plate, having a proximal end for receiving said components from said independent sources, and a distal end terminating proximate said first predetermined location; and
   a plurality of interchangeable modular troughs, removably secured to said base plate and adapted to enable a versatile arrangement of said troughs on said tray, each of said troughs corresponding to one of said sources and providing a path for guiding said components to said distal end of said base plate, each of said troughs sized to accommodate components of a particular size, each of said interchangeable modular troughs comprising:
   an upwardly facing surface, upon which said supply tubes and said components travel;
   a side wall, secured to said upwardly facing surface of said trough on one edge there of, said upwardly facing surface having an edge parallel to said side wall forming an open side, wherein each side wall of each of said troughs is adapted to abut the open side of an adjacent trough and effectively form a second side wall on said adjacent trough, for guiding said supply tubes down the length of said trough; and
   a pair of aligning walls, secured to said upwardly facing surface, on opposite sides thereof, said aligning walls tapering and narrowing so as to center said component as said component approaches said first predetermined location.

5. An apparatus for advancing a plurality of electronic components of various sizes from a plurality of supply tubes, each of said supply tubes containing components of the same size and shape for a given supply tube, but which may vary among tubes, said apparatus adapted to advance said components from each of said tubes along respective paths to a respective pick up station, from which said components may be lifted from said location by a pick and place machine and moved to a respective second predetermined location, said apparatus comprising:

a base plate, having a proximal end and a distal end;

a plurality of interchangeable modular troughs, slidably mounted and removably secured to said base plate, each of said troughs corresponding to one of said supply tubes and adapted to provide said respective paths to guide said components from said supply tubes to said pick up station, each of said modular troughs comprising:

an upwardly facing surface upon which said tubes and said components travel in said proximal and distal ends, respectively;

a ledge portion adapted to separate said proximal end from said distal end, said ledge portion proportionately sized and shaped such that when one of said tubes is inserted into one of said troughs, said tube will align with and abut said ledge portion to provide a smooth transition therebetween; and a side wall, secured to said upwardly facing surface on said receiving portion on one edge thereof, and adapted to be shared by an adjacent trough so as to effectively provide two side walls for each of said troughs, so as to guide said tubes into said troughs;

means for vibrating said tray so as to aid the advancement of said electronic components toward said pick up station; and a stop plate, proximate to said pick up stations for retaining said components within each of said modular troughs until said components are moved by said pick and place machine.

6. A pick and place machine adapted to pick up an electronic component from a respective first predetermined location, carry said component to a precisely defined respective second predetermined location, and place said component onto a precisely defined position on a printed circuit board at said respective second location, said apparatus comprising:

a chuck, movable between said respective first predetermined location from which said component is to be taken and said respective second predetermined location to which said component is to be transferred, said chuck having a tip which provides a vacuum for detachably securing said component to said tip;

a movable work table, adapted to positioning said printed circuit board relative to said chuck so as to enable said chuck to place said component in the desired location;

a vibrating modular feed tray having a proximal end and a distal end;

a plurality of interchangeable modular troughs, secured to said feed tray, each of said troughs adapted to supplying said components along a respective path to said respective first location, each of said modular troughs comprising:

a proximal end and a distal end corresponding to said proximal and distal ends of said feed tray, respectively;

an upwardly facing surface upon which said components travel;

a side wall, secured to said upwardly facing surface on one edge of said proximal end of said trough, and adapted to be shared by an adjacent trough so as to effectively provide two side walls for each of said troughs; and a pair of aligning walls, disposed proximate to said distal end of said trough, said aligning walls tapering and narrowing toward said distal end so as to center said component as said components travels toward said first respective predetermined location; and a plurality of independent sources for supplying said components to said feed tray.

* * * * *